(12) United States Patent
Watkins (10) Patent No.: US 6,775,798 B2
(45) Date of Patent: Aug. 10, 2004

(54) FAST SAMPLING TEST BENCH

(75) Inventor: Daniel R. Watkins, Saratoga, CA (US)

(73) Assignee: LSI Logic Corporation, Milpitas, CA (US)

( * ) Notice: Subject to any disclaimer, the term of this patent is extended or adjusted under 35 U.S.C. 154(b) by 407 days.

(21) Appl. No.: 09/996,042

(22) Filed: Nov. 28, 2001

(65) Prior Publication Data

US 2003/0101393 A1 May 29, 2003

(51) Int. Cl.[7] .............................................. G01R 31/28
(52) U.S. Cl. ........................ 714/733; 714/727; 714/729
(58) Field of Search .......................... 714/39, 727, 741, 714/726, 733, 729; 438/14; 702/120; 716/4

(56) References Cited

U.S. PATENT DOCUMENTS

| | | | |
|---|---|---|---|
| 5,526,286 A | | 6/1996 | Sauerwein et al. .......... 364/550 |
| 5,942,927 A | | 8/1999 | Etheridge et al. .......... 327/158 |
| 6,182,247 B1 | * | 1/2001 | Herrmann et al. ............ 714/39 |
| 6,429,029 B1 | * | 8/2002 | Eldridge et al. .............. 438/14 |
| 6,460,148 B2 | * | 10/2002 | Veenstra et al. .............. 714/39 |
| 6,498,999 B1 | * | 12/2002 | Reise ......................... 702/120 |
| 6,564,347 B1 | * | 5/2003 | Mates ......................... 714/727 |
| 6,567,946 B1 | * | 5/2003 | Nozuyama ................... 714/741 |
| 6,567,957 B1 | * | 5/2003 | Chang et al. .................. 716/4 |
| 6,687,865 B1 | * | 2/2004 | Dervisoglu et al. ......... 714/726 |

* cited by examiner

Primary Examiner—David Ton
(74) Attorney, Agent, or Firm—Luedeka, Neely & Graham (57) ABSTRACT

An apparatus and method for using the apparatus for reducing analysis time of integrated circuits. The apparatus includes an integrated logic analyzer inserted in a substrate containing the integrated circuit and means for accelerating circuit analysis using the integrated logic analyzer. The means may be selected from the group consisting of a high speed sampling circuit coupled to the integrated logic analyzer and an on-board circuit testing and analysis apparatus including the integrated logic analyzer. Use of the apparatus enables lower production costs by speeding up circuit analysis as well as providing analysis of high speed circuits in a cost effective manner.

19 Claims, 7 Drawing Sheets

FAST SAMPLING TEST BENCH

FIELD

This invention relates to the field of integrated circuit development and design. More particularly, this invention relates to improved methods and apparatuses for analyzing logic circuits to reduce testing time.

BACKGROUND

Integrated circuits are tested to determine proper functionality and the existence of defects which may introduce faults in the integrated circuit during use. Current sampling and analysis techniques are limited by currently available hardware and software. For example, integrated logic analyzers have been used with integrated circuits to monitor and trace signals during circuit analysis. However, such analyzers are typically limited to trace speeds of about one hundred and fifty-five megahertz and up to about 256 signals. As the speed of the integrated circuits and memory devices increases, sampling speeds higher than about one hundred and fifty-five megahertz are desirable so that there is a more complete capture of the traces for analysis of the circuit. More accurately capturing high speed signals would enable a reduced debug time, thereby saving production costs for the integrated circuits.

Another disadvantage of current analysis techniques for integrated circuits is that the simulation and analysis of the circuits is often limited by the speed at which the analytical tools can process the scan information input to the circuits. Conventional analysis tools run simulation generated vectors for fault coverage and functional analysis of the integrated circuit by use of input output pins in the circuit. However, internal nodes and high speed circuits may or may not be adequately tested. Failure analysis of the circuit is difficult to perform without considerable time and effort. Furthermore, fault coverage improvement is limited by the tool capabilities. Once the fault coverage report is generated, fault coverage improvement is often added manually. Hence, there exists a need to provide analysis tools and methods which reduce testing time and provide more automated analysis of circuits to improve fault coverage for higher yield of useable parts.

SUMMARY

The above and other needs are met by an apparatus and method for using the apparatus to reduce analysis time of integrated circuits. The apparatus includes an integrated logic analyzer inserted in a substrate containing an integrated circuit having a predetermined functionality. Means are provided for accelerating circuit analysis, the means being selected from the group consisting of a high speed sampling circuit coupled to the integrated logic analyzer and an on-board circuit testing and analysis apparatus including the integrated logic analyzer.

In another aspect the invention provides a method for high speed sampling of digital signals running above about one hundred and fifty-five megahertz. The method includes the steps of providing a high speed sampling circuit coupled to an integrated logic analyzer including sampling circuit registers running at about one gigahertz or more, capturing signals in about one half of the sampling circuit registers, the signals having a value different from a previous value in the registers, and storing the captured signals and a real time clock value corresponding to the captured signals in one-half of the sampling circuit registers.

In yet another aspect, the invention provides a method for integrated circuit analysis. The method includes the steps of providing an on board circuit testing and analysis circuit including a test bench simulation circuit for simulated signal feed and simulated signal capture of selected internal points, the test bench simulation circuit including an integrated circuit analysis device, and programming the integrated logic analyzer to reduce integrated circuit analysis time.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Conventional logic analyzers have limited ability to capture signals on a real time basis. The typical capture time for a conventional logic analyzer is about four nanoseconds. The signals that are captured are typically fed to an oscilloscope for trace analysis. However, a conventional oscilloscope has a limited number of channels for capture and display of the signals used to generate a real time trace. An integrated logic analyzer and associated software program has the ability to monitor and trace up to about 256 signals simultaneously at speeds up to about one hundred and fifty-five megahertz. Hence, integrated logic analyzers significantly increase the ability of chip manufacturers to test circuits for proper functioning.

However, despite their increased ability and sample speed, conventional integrated logic analyzers are deficient in providing for sampling needs for trace analysis of circuit functions at speeds of about one hundred and fifty-five megahertz or more. Furthermore, even with digital signals running at less than about one hundred and fifty-five megahertz, over sampling to assess rise time, fall time, latency relative to clock timing or latency relative to other signal timing may be needed to adequately debug a circuit or to determine circuit integrity.

Figure 1:
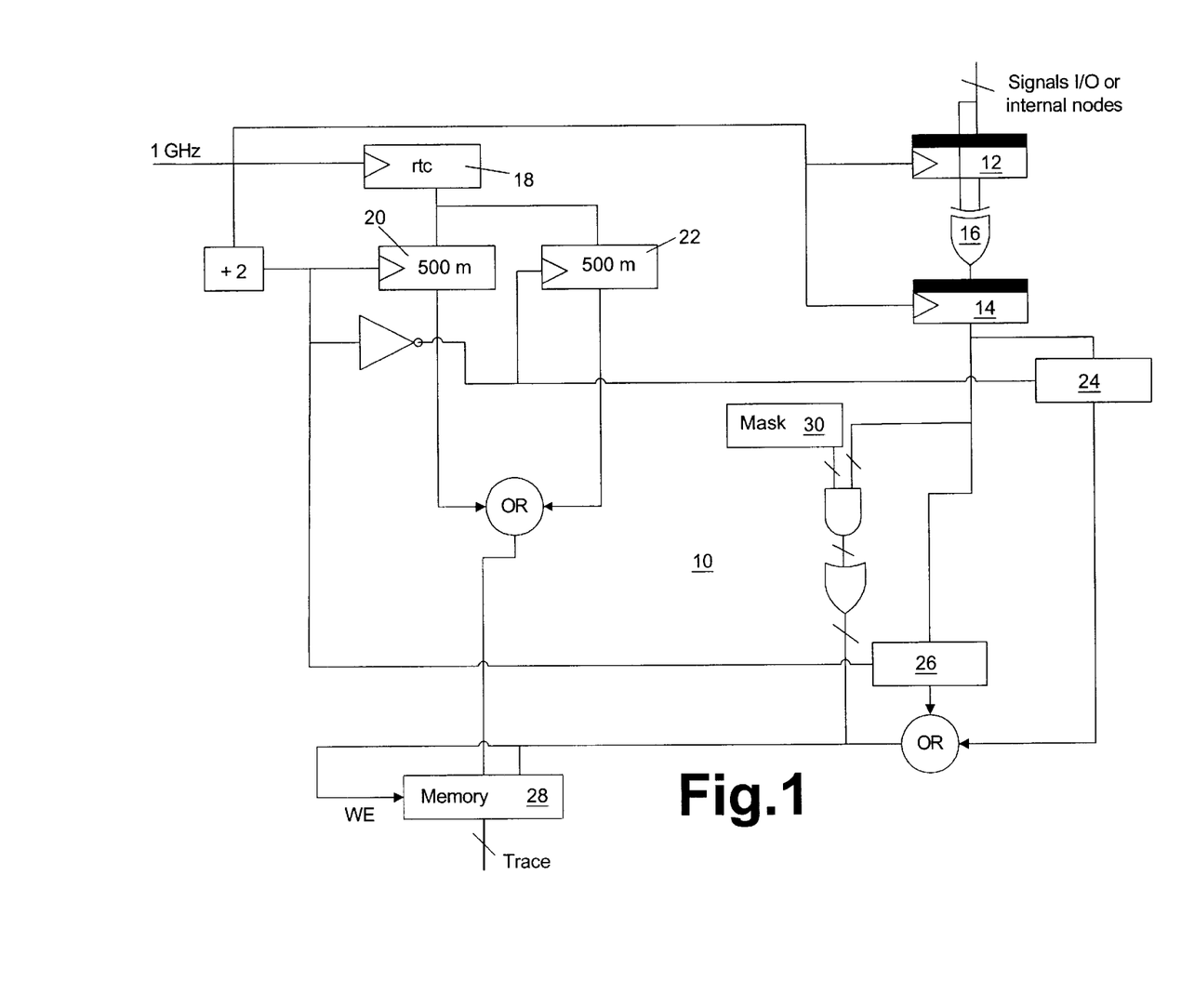
FIG. 1 is a diagrammatic view of a device for capturing high speed signals during integrated circuit testing according to one aspect of the invention.

One aspect of the invention provides an apparatus and method for improved sampling of high speed signals or over sampled signals. Referring now to FIG. 1 there is shown an apparatus 10 for high speed sampling of digital signals at greater than about one hundred and fifty-five megahertz and for analyzing the sampled signals according to a first aspect of the invention. The apparatus 10 includes high speed sampling registers 12 and 14 which are coupled to input output signals or internal nodes of an integrated circuit. The high speed sampling register 12 or 14 captures a signal at a high clock rate if the previous signal value is different than the current signal value. If the previous value and current value of the signal are the same, the current signal is not captured or stored for later analysis. The high speed sampling registers 12 and 14 run at about one gigahertz or more.

The input signal is either captured by high speed sampling register 12 or high speed sampling register 14 by using an exclusive OR gate 16 disposed between the signal input and the registers 12 and 14. A clock value is generated by real time clock 18 running at about one gigahertz or more to provide a clock value at the time the signal is sampled. As shown in FIG. 1, memories 20 and 22 running at about half rate of the sampling circuit register 12 or 14 are preferably used to capture and store the clock value corresponding to the captured signal. In FIG. 1, the sampling circuit registers 12 and 14 run at about one gigahertz, hence memories 20 and 22 run at about five hundred megahertz. The captured signal and corresponding real time value are provided to relatively low speed register 24 or 26 for storage in a memory 28 running at about one sixth rate of the sampling circuit registers 12 and 14. For example, in FIG. 1 the low speed registers 24 and 26 run at about one hundred and fifty-five megahertz. In the alternative the captured signal and corresponding real time value may be masked by mask 30 before being stored in memory 28.

The memory 28 stores the captured signals corresponding to real time clock values as multiple words stored in a one sixth rate register which can then be written as a one sixth rate trace to an integrated logic analyzer. The integrated logic analyzer is preferably on the substrate containing the integrated circuit or alternately in a separate analytical device electrically coupled to the integrated circuit during circuit testing. Accordingly, the apparatus 10 provides a means for inputting high speed digital signals to an integrated logic analyzer despite the limitation of the logic analyzer to directly capture such high speed signals.

Once the signals from memory 28 are input as traces to the integrated logic analyzer, the software provided with the integrated logic analyzer is preferably used to reconstruct the signals in order to display the signals at the proper time so that analysis of the circuit can be achieved. Suitable software is available, for example, from Xilinx, Inc. of San Jose, Calif. under the trade name CHIPSCOPE. Since all change times for all captured signals are available in memory 28, a full record of all the signals used for circuit analysis is provided. Accordingly, all signals may be viewed, specific signals may be viewed or signals at any specific time may be viewed to determine if the integrated circuit is functioning properly. Because previously unavailable high speed signals may be captured by the apparatus 10 of the invention, the visibility of these signals enables reduced trial and error debugging time. Hence, integrated circuits containing the apparatus for coupling to integrated logic analyzers provide reduced analysis time before the integrated circuits are ready for market and manufacturing.

In another aspect the invention provides circuit analysis apparatus and methods for extending the simulation abilities of test bench simulation programs to perform functions such as accelerated chip testing, automated fault coverage improvement and for reducing the number of test vectors required for conducting functional tests of integrated circuits. Again, the apparatus and methods extend the capabilities of integrated logic analyzers to achieve the desired results as described in more detail below.

With reference now to FIGS. 2–8, various aspects of the invention will now be described. In this embodiment, the integrated logic analyzer may be used external or embedded internally in the substrate of the integrated circuit to provide circuit analysis capability. Whether or not the integrated logic analyzer is embedded in the substrate, the integrated logic analyzer may be used to provide simulation stimuli to selected internal points or nodes to provide outputs characteristic of the predetermined function of the circuit. A test bus, for example on a set top box chip such as an SC2005 chip available from LSI Logic, Inc. of Milpitas, Calif., provides a multiplexed bus which may be used to provide simulation capture of the selected internal signals. The combined integrated logic analyzer and test bus are used in conjunction with a test bench program to provide verification of circuit function.

Figure 2:
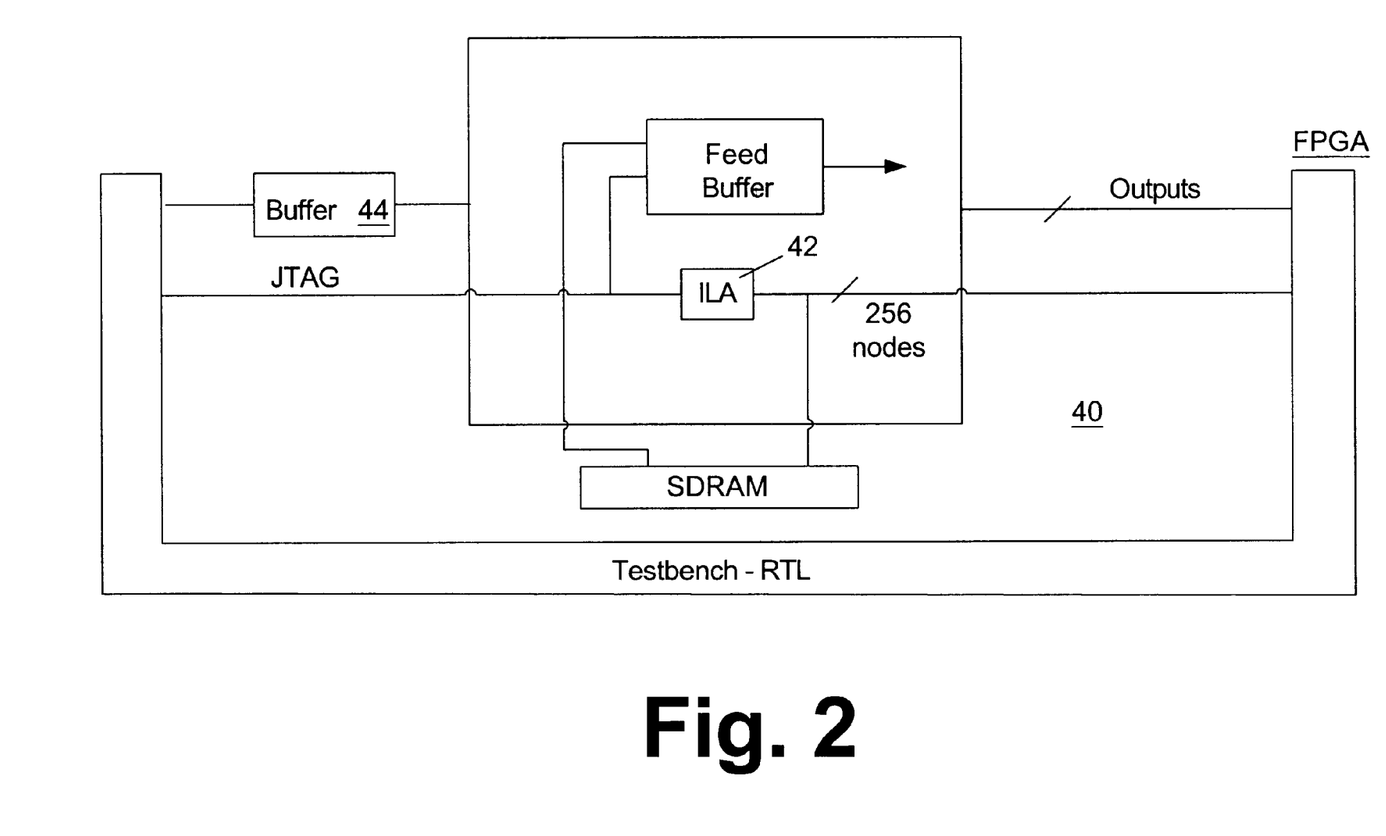
FIG. 2 is a diagrammatic view of use of an integrated circuit analyzer in a test bench circuit simulation tool inserted in an integrated circuit substrate according to another aspect of the invention.
Figure 3:
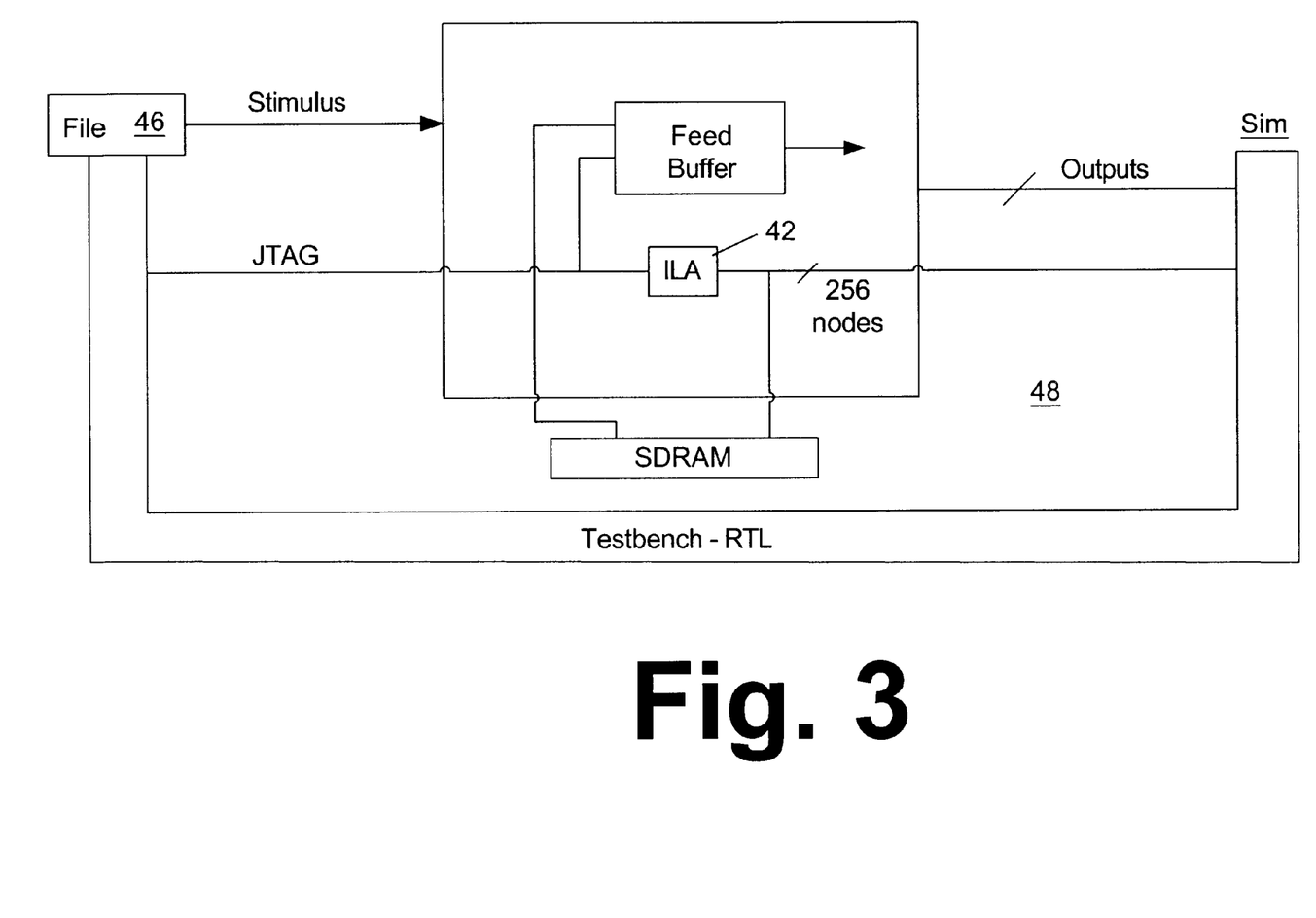
FIG. 3 is a diagrammatic view of use of an integrated circuit analyzer in a test bench circuit simulation tool for off integrated circuit substrate analysis of test cases according to the invention.

Referring now to FIGS. 2 and 3, a real time logic test bench 40 including an embedded integrated logic analyzer 42 is provided. The integrated logic analyzer 42 may be external to the substrate containing the integrated circuit or may be integral with the integrated circuit on the substrate. The test bench 40 uses the integrated logic analyzer 42 to provide simulation stimuli to selected internal nodes and can provide simulation capture of selected signals. Verification or testing commands are logged with a corresponding clock value in a log file 44, as given in FIG. 2. Upon re-use by the integrated circuit test bench (FIG. 2) or the simulation test bench (FIG. 3), the commands may be executed at the proper time. With trace expanded to write to a main memory 28 (FIG. 1), using a trace buffer compression routine, large trace captures may be achieved effectively expanding simulation testbench testcases to silicon testbench testcases. Hence, whatever is run in simulation may be run in silicon and vice versa as shown in FIGS. 2 and 3.

Referring again to FIG. 2, the integrated logic analyzer 42 is internal to the chip and thus during test bench runs, stimuli input is provided from a buffer 44, circuit operation occurs, traces are captured and the integrated logic analyzer performs analysis of various functions by analyzing traces. The resulting traces are written to the main chip memory and may be easily coupled to off-chip memory so that large trace captures can be performed during a single simulation test.

In the simulation environment shown in FIG. 3, the integrated logic analyzer 42 may be external to the chip, however, the principle remains the same as described with reference to FIG. 2. A file 46 containing the analytical stimuli is input to test bench 48 containing integrated logic analyzer 42. The outputs resulting from analysis of the stimuli is fed to the chip simulation software for simulation of integrated circuit functions based on the stimuli. Using the integrated logic analyzer as described above, the tester coupled to a chip can capture SDRAM output to 100 megahertz so that captured traces can be compared to expected simulation results. Use of this apparatus provides significant reduction in tester time. For example, the SC2005 chip takes 0.595 second for gross functional testing, 1.7 seconds for scan functional testing and 1.3 seconds for VDAC testing. The apparatus and method described above preferably reduces the total testing time from about 3.6 seconds to about 1.6 seconds, resulting in significant testing costs savings.

Figure 4:
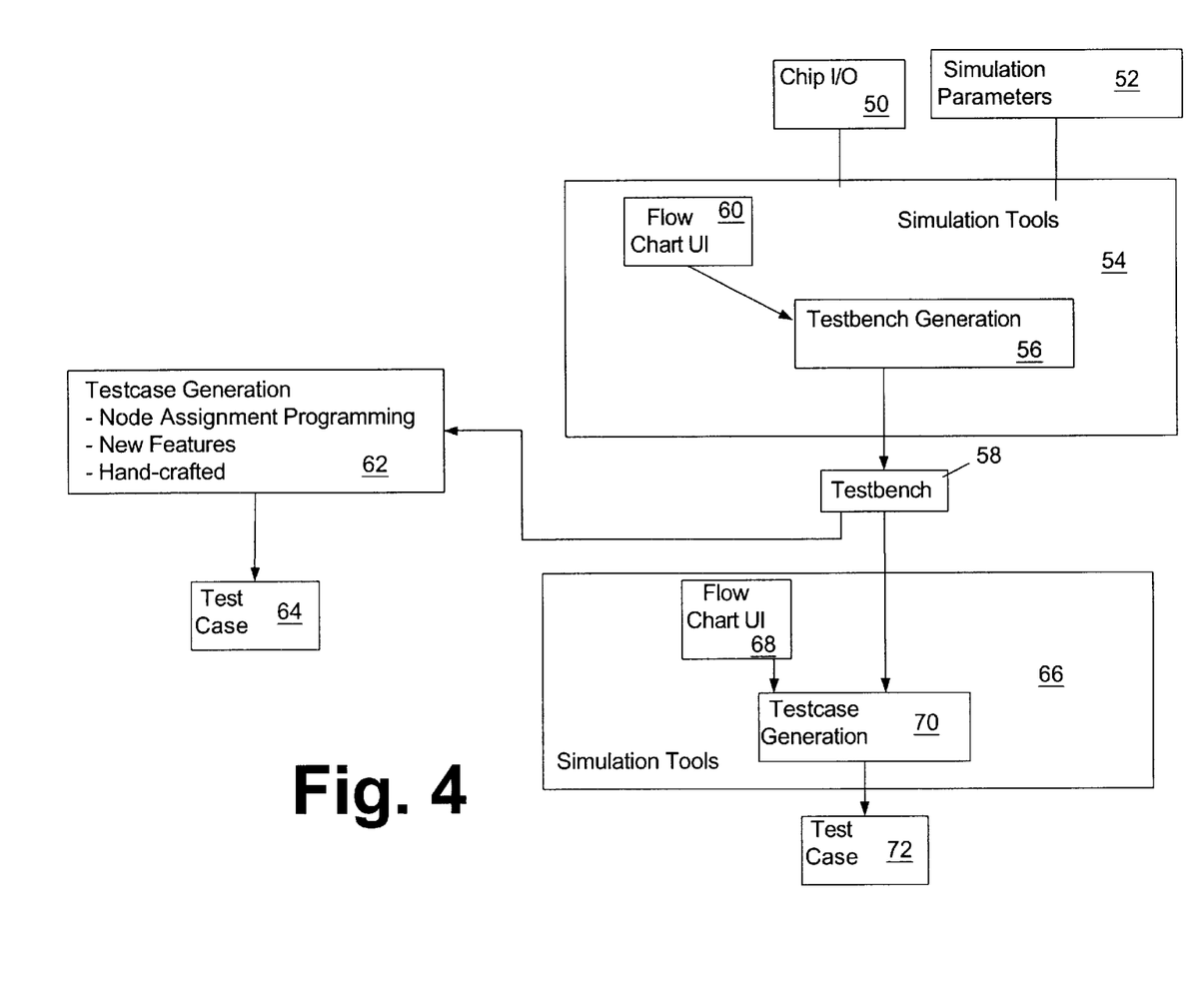
FIG. 4 is a flow diagram for automatic generation of a test bench circuit simulation tool including an integrated circuit analyzer according to the invention.

FIG. 4 illustrates a use of conventional chip simulation programs to provide input logic to the test bench for automatic generation of stimuli used to analyze the integrated circuit using the integrated logic analyzer as described above. Where the testcase generation is provided automatically by simulation software, the node assignments are provided in sync between simulation or silicon or independently therefrom. For example, the identification 50 of the chip input output pins and predetermined parameters 52 for the integrated logic analyzer, scan and bus logic for integrated circuit testing for the chip may be input to conventional software 54 for generating algorithms to be used to generate a test bench program 56 for the test bench 40 or 48 (FIG. 2 or 3 respectively). The test bench program may also be modified by a user interface input 60. The test bench 58 may be further modified by testcase generation interface 62 to provide the test case 64 for analyzing the integrated circuit or the output from the test bench 58 may be further modified by the simulation software 66 and user interface 68 to provide automatic generation of test case parameters 70 for a test case 72 for analyzing the integrated circuit circuits.

Figure 5:
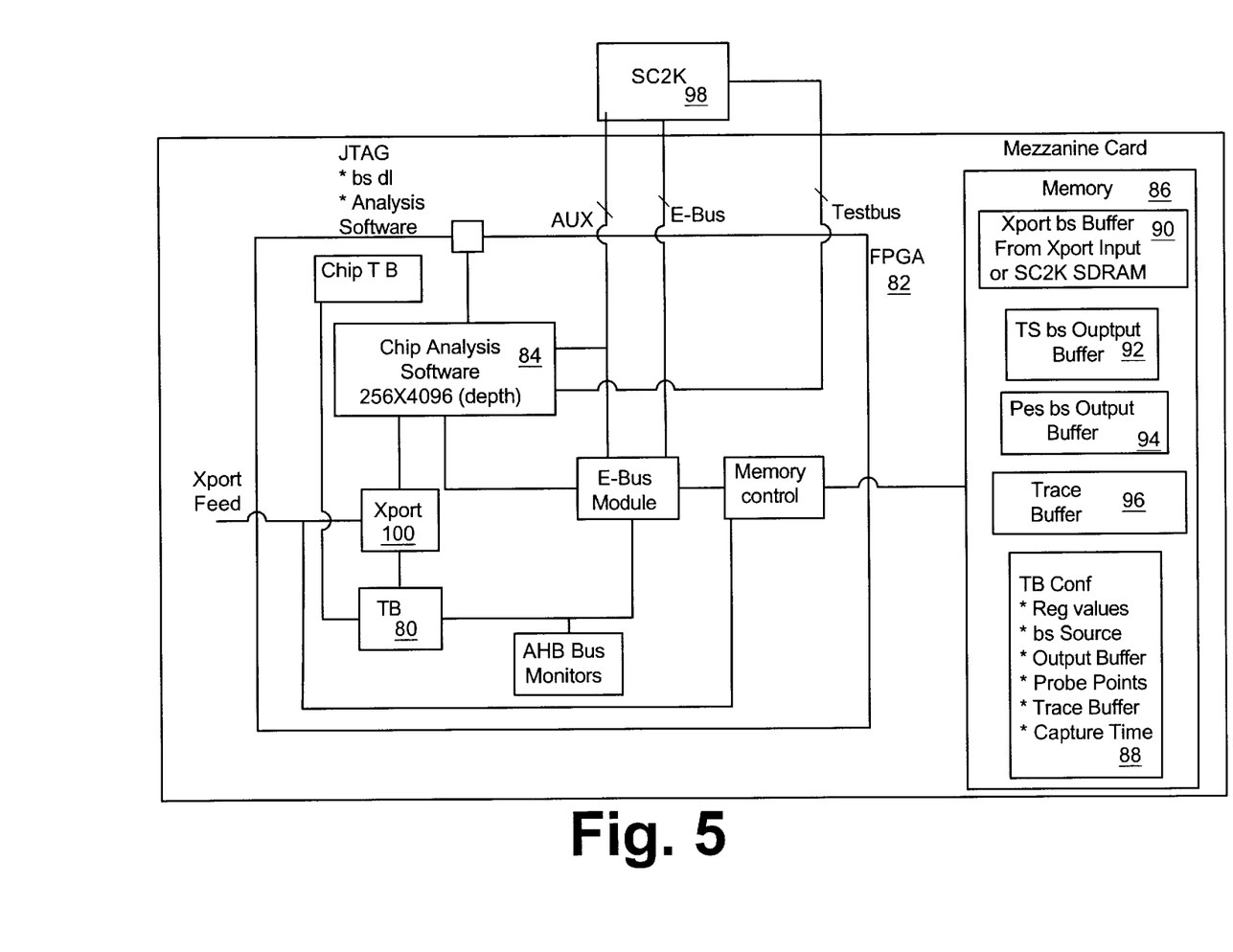
FIG. 5 is a block diagram representing the use of test bench circuit simulation tools in the analysis of an integrated circuit.

FIG. 5 provides a block diagram for use of integrated logic analyzer and associated software for chip simulation and testing for real time logic testing of integrated circuits. FIG. 5 illustrates a simulation testbench (TB) 80 embedded in an FPGA 82 and associated chip analysis software 84. A memory 86 which supports the testbench configuration (TB Conf) 88 and buffers 90, 92, 94 and 96 is also attached to the FPGA 82. In FIG. 5, SC2K 98 represents an LSI Logic integrated circuit. "xport" 100 is a transport demux function which is emulated in the FPGA 82. "TS bs Output Buffer" 92 is a transport bitstream output buffer. "Pes bs Output Buffer" 94 is a program elementary bitstream buffer. "Reg values", are register values. "bs Source" is a bitstream source. "bs dl", is a bitstream download. "AUX" is the auxiliary port access to the FPGA 82 by the SC2K 98. "E-Bus" is the SC2K 98 external bus access to the FPGA 82, and "AHB" is the type of bus used.

Benefits of providing a test bench 40 or 48 including an integrated logic analyzer include enabling self-testing of circuit functions without the need for additional input output pins. The functional self-testing can be performed in real time to verify conditions such as central processing unit speed and the like. Tests run at chip speed can accelerate the entire chip function testing thereby reducing testing time and costs. Furthermore, early determination of central processing unit speed provides quicker sorting of parts for testing. Self-testing of the central processing unit speed by an integrated logic analyzer in the test bench 40 or 48 can provide direct capture of central processing unit speed by the chip tester from a read out of the chip trace memory or by capturing the chip SDRAM interface pins.

Because the integrated logic analyzer may be used in the test bench 40 or 48 for self-testing of the integrated circuit functionality, less vectors need to be input for complete testing of the integrated circuit. Accordingly, the software used to run the integrated logic analyzer can provide instructions based on the output from the test bench to the central processing unit bus which enable the integrated circuit to be tested in real time with fewer vectors than required for conventional testing of the integrated circuit.

Figure 6:
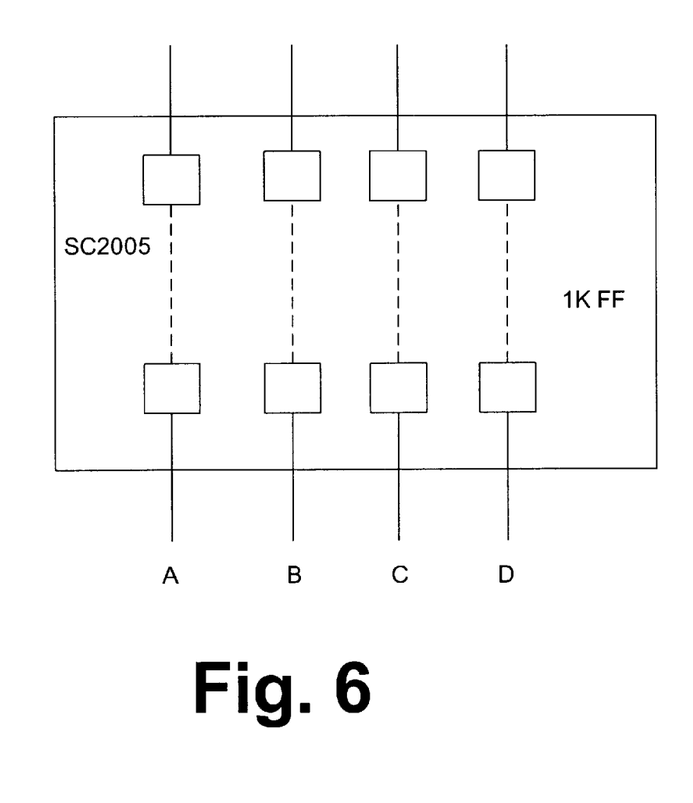
FIG. 6 is a schematic representation of scan chains for conventional scanning of an integrated circuit device.

Furthermore, the integrated logic analyzer provides means for coupling the integrated logic analyzer to the scan software used to improve fault coverage of the chip. In FIG. 6, a plurality of individual scan chains represented by scans A–D are required for complete fault coverage analysis of an integrated circuit. By using the integrated logic analyzer 102 to provide loading of the scan chains E–H, and reading out of the resulting scan information, as given in FIG. 7, the number of equal length scan chains can be increased while reducing the scan time. Accordingly, for a 1000 FF scan chain running at about twenty megahertz, the read in time of the scan chain is about fifty microseconds.

Figure 7:
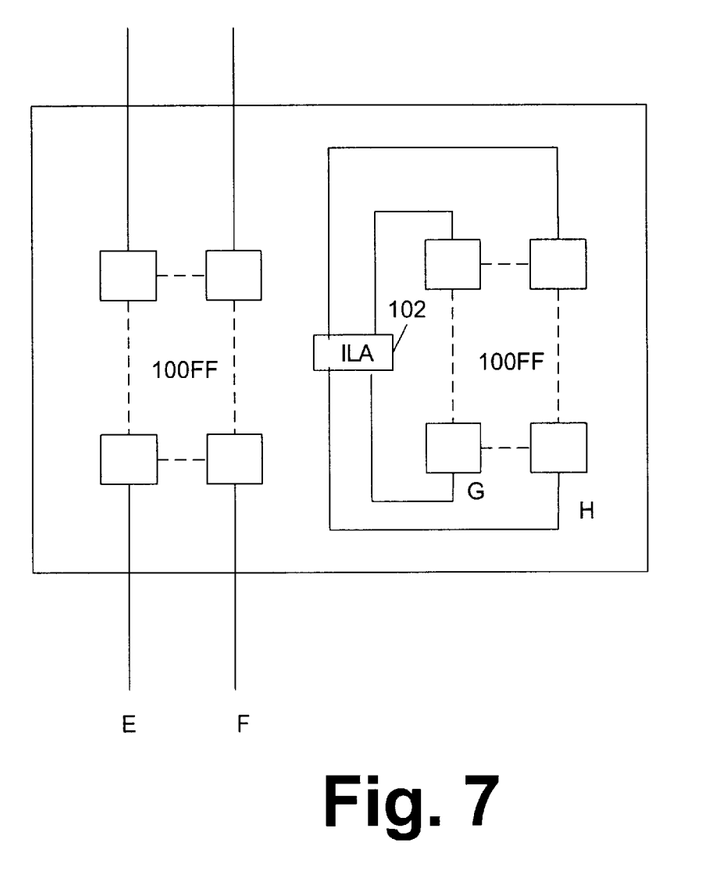
FIG. 7 is a schematic representation use of an integrated circuit analyzer to increase the speed of scan chain scan analysis of an integrated circuit device.

By using the integrated logic analyzer 102 to load the scan vectors and read the scan chain results, the scan time is reduced proportionately from about 1.7 seconds to about 0.2 seconds with only about ten more signals to route per scan chain which represents about a 10× improvement. If the scan for the scan chains in FIG. 7 are run at central processing unit speed, there will be a further speed up of functional testing of the integrated circuit. For example, if the scan is run at about fifty-four megahertz instead of about twenty megahertz, the scan test will be completed in less than about half the time.

Fault coverage may also be improved using the integrated logic analyzer in conjunction with real time logic analysis of the integrated circuit device. The integrated logic analyzer may be programmed to probe selected nets and the integrated logic analyzer and test bus can be used to probe internal buses at the appropriate time to achieve predetermined fault coverage goals. As shown in FIG. 7, the integrated logic analyzer 102 enables an increase in the number of scan chains available for scan testing, registers to capture a bus and scan out the bus value are also made available for fault coverage grading using a tool 104 to take advantage of the analysis provided by the integrated logic analyzer without adding additional input output pins or input output functionality.

Figure 8:
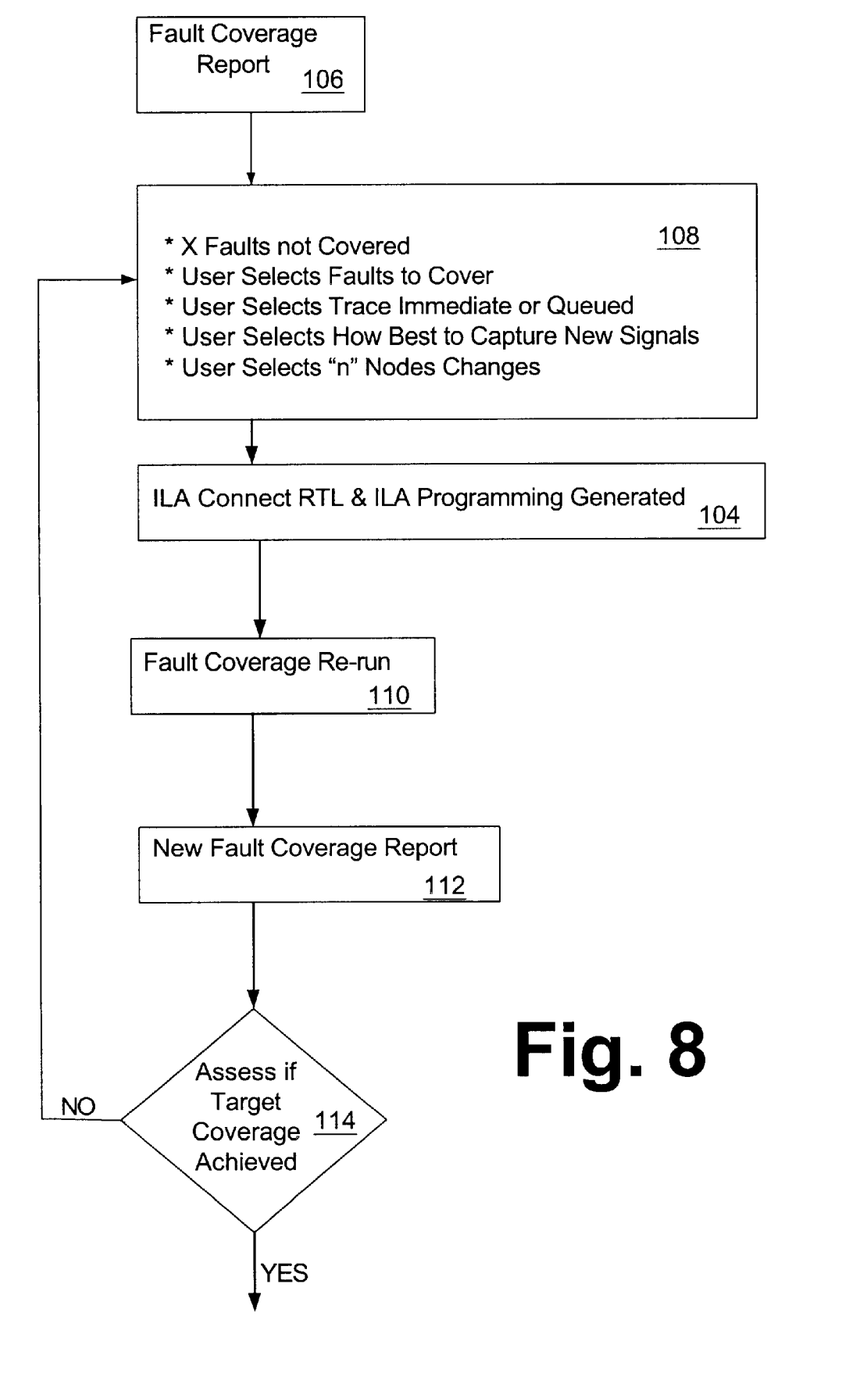
FIG. 8 is a schematic representation of a tool using an integrated circuit analyzer to improve fault coverage of an integrated circuit according to the invention.

As set forth in the flow diagram in FIG. 8, a fault coverage report 106 for an integrated circuit device is provided. The user provides selected user inputs 108 to the tool 104 to provide a desired fault coverage result. Based on the unobserved faults from the fault coverage report 106, the user selected nodes based on signal name, level of nesting or module to be added to the integrated logic analyzer to improve coverage thereof. The nodes are typically added in the first pass of the tool 104 and the fault grading is rerun in step 110 to provide an updated fault grading report 112. If the target fault coverage is achieved in step 114, the process is completed. If on the other hand, the target coverage is not achieved in step 114, the inputs 108 are changed and the tool 104 is used to obtain a new fault coverage report 112.

Node assignments may be made using conventional modeling software such as MATLAB software available from The Mathworks, Inc. of Natick, Mass. for use by the integrated logic analyzer. The user also selects to have the integrated logic analyzer trace results output to the chip SDRAM interface on capture thereof or queue the traces for later upload to the SDRAM interface of the chip. The nodes states are read out to the SDRAM bus as s-bus trace to memory transactions.

Prior to running the software 104, the user selects whether to capture the added fault coverage signal each time it is generated, only when there is a change in the signal, for a specific period of time, for a change in the signal for a specific period of time, for a specific period of time relative to other signals or when there is a change of the signal within a specific period of time relative to other signals. The user may also select to capture a predetermined number "n" of node changes during fault coverage report generation. The integrated logic analyzer for tool 104 may be programmed to receive scan vectors via wide and fast buses and apply them fast and also capture them fast for fast comparison to parallel buses.

Benefits from using the integrated logic analyzer and test bus in a test bench include the ability to perform silicon verification on modules either as extensions of module simulation or module built in self tests. For example, a module that does not have sufficiently high fault coverage could use a module built in self test to ensure production testers are adequately screening parts for compliance with specifications. The module built in self test may be run at speed thereby decreasing the test time for the module.

The foregoing embodiments of this invention have been presented for purposes of illustration and description. They are not intended to be exhaustive or to limit the invention to the precise form disclosed. Obvious modifications or variations are possible in light of the above teachings. The embodiments are chosen and described in an effort to provide illustrations of the principles of the invention and its practical application, and to thereby enable one of ordinary skill in the art to utilize the invention in various embodiments and with various modifications as is suited to the particular use contemplated. All such modifications and variations are within the scope of the invention as determined by the appended claims when interpreted in accordance with the breadth to which they are fairly, legally, and equitably entitled.

What is claimed is:

1. An apparatus for reducing analysis time of integrated circuits, the apparatus comprising:
   a substrate containing an integrated circuit having a predetermined functionality, an integrated logic analyze inserted in the substrate, and
   means for accelerating circuit analysis, the means comprising a high speed sampling circuit coupled to the integrated logic analyzer, wherein the sampling circuit includes sampling circuit resisters running at about one gigahertz or more and the registers are disposed to capture signals having a value different from a previous value.

2. The apparatus of claim 1 further comprising memory running at about half rate of the sampling circuit registers for storing the captured signals and a real time clock value for the captured signals.

3. The apparatus of claim 2 further comprising a mask for masking the captured signals and real time clock values before the captured signals and values are stored to memory.

4. The apparatus of claim 3 further comprising a tool for reconstructing the stored clock values and captured signals and feeding the captured signals to the integrated logic analyzer for circuit analysis.

5. The apparatus of claim 1 wherein the analysis time reduced by the means for accelerating circuit analysis comprises chip functionality and fault coverage analysis.

6. An apparatus for reducing analysis time of integrated circuits, the apparatus comprises:
   a substrate containing an integrated circuit having a predetermined functionality,
   an integrated logic analyzer inserted in the substrate, and
   means for accelerating circuit analysis, the means being selected from a group consisting of a high speed sampling circuit coupled to the integrated logic analyzer and an on-board circuit testing and analysis apparatus including the integrated logic analyzer.
   wherein the analysis time reduced by the means for accelerating circuit analysis comprises signal integrity analysis of signals sampled at about a one sixth rate of the sampling circuit registers.

7. The apparatus of claim 6 wherein the means for accelerating circuit analysis comprises an on-board circuit testing and analysis circuit wherein the analysis circuit includes a test bench simulation circuit for simulated signal feed and simulated signal capture of selected internal points.

8. The apparatus of claim 7 further comprising off chip memory for storing the captured signals.

9. The apparatus of claim 7 further comprising on chip memory for storing the captured signals.

10. The apparatus of claim 7 further comprising a tool for automated insertion of simulated signal feed and simulated signal capture to the test bench simulation circuit.

11. A method for high speed sampling of digital signals comprising:
    providing a high speed sampling circuit coupled to an integrated logic analyzer including sampling circuit registers running at about one gigahertz or more,
    capturing signal running at about a one half rate of the sampling circuit registers, the signals having a value different from a previous value in the registers, and
    storing the captured signals and a real time clock value corresponding to the captured signals in a memory running at about a one half rate of the sampling circuit registers.

12. The method of claim 11 further comprising reconstructing the stored signals at their corresponding clock value and feeding the reconstructed signals to to integrated logic analyzer for display and analysis.

13. The method of claim 11 further comprising masking the captured signals and real time clock values before storing the signals and corresponding clock value.

14. An apparatus for integrated circuit analysis and testing comprising:
    a machine readable program including a simulated integrated circuit having a predetermined functionality, a logic analyzer simulation tool coupled to the simulated integrated circuit, and a simulated high speed sampling circuit coupled to the logic analyzer simulation tool for capturing and analyzing circuit function, wherein the simulated sampling circuit includes sampling circuit registers running at about one gigahertz or more and the registers are disposed to capture signals having a value different from a previous value, and
    a machine capable of acting on the machine readable program to provide integrated circuit analysis and testing.

15. The apparatus of claim 14 further comprising memory running at about a one half rate of the sampling circuit registers for storing the captured signals and a real time clock value for the captured signals.

16. The apparatus of claim 15 further comprising a mask for masking the captured signals and real time clock values before the captured signals and values are stored to memory.

17. The apparatus of claim 16 further comprising a tool for reconstructing the stored clock values and captured signals and feeding the captured signals to the integrated logic analyzer for circuit analysis.

18. The apparatus of claim 14 wherein the analysis time reduced by the means for accelerating circuit analysis comprises chip functionality and fault coverage analysis.

19. An apparatus for integrated circuit analysis and testing comprising:
    a machine readable program including a simulated integrated circuit having a predetermined functionality, a logic analyzer simulation tool coupled to the simulated integrated circuit, and a simulated high speed sampling circuit coupled to the logic analyzer simulation tool for capturing and analyzing circuit function, and a machine capable of acting on the machine program to provide integrated circuit analysis and testing, wherein the analysis time reduced by the means for accelerating circuit analysis comprises signal integrity analysis of signals sampled at about a one sixth rate of the sampling circuit registers.

* * * * *